United States Patent
Van Heumen

(10) Patent No.: US 9,913,357 B2
(45) Date of Patent: Mar. 6, 2018

(54) RADIATION SOURCE, METROLOGY APPARATUS, LITHOGRAPHIC SYSTEM AND DEVICE MANUFACTURING METHOD

(71) Applicant: ASML Netherlands B.V., Veldhoven (NL)

(72) Inventor: Martijn Petrus Christianus Van Heumen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/103,640

(22) PCT Filed: Nov. 14, 2014

(86) PCT No.: PCT/EP2014/074660
§ 371 (c)(1),
(2) Date: Jun. 10, 2016

(87) PCT Pub. No.: WO2015/086259
PCT Pub. Date: Jun. 18, 2015

(65) Prior Publication Data
US 2016/0309571 A1  Oct. 20, 2016

(30) Foreign Application Priority Data

Dec. 13, 2013 (EP) .................. 13197289.5

(51) Int. Cl.
*G03F 7/20* (2006.01)
*H05G 2/00* (2006.01)
(Continued)

(52) U.S. Cl.
CPC ......... *H05G 2/008* (2013.01); *G03F 7/70016* (2013.01); *G03F 7/70191* (2013.01);
(Continued)

(58) Field of Classification Search
None
See application file for complete search history.

(56) References Cited

U.S. PATENT DOCUMENTS 4,633,128 A   12/1986 Roberts
5,594,303 A    1/1997 Simpson et al.
(Continued)

FOREIGN PATENT DOCUMENTS

CN    101859687 A   10/2010
EP      2202778 A2    6/2010
(Continued)

OTHER PUBLICATIONS

English-Language Abstract for Taiwanese Patent Publication No. TW 2012/35796, published Sep. 1, 2012; 1 page.
(Continued)

*Primary Examiner* — Steven H Whitesell Gordon
(74) *Attorney, Agent, or Firm* — Sterne, Kessler, Goldstein & Fox P.L.L.C.

(57) ABSTRACT

A radiation source apparatus comprising: a container comprising walls for defining a space for containing a gaseous medium in which plasma which emits plasma emitted radiation is generated following excitation of the gaseous medium by a driving radiation; and a thermal load applicator adapted to apply a thermal load to at least part of the walls of the container to reduce stresses in the walls.

26 Claims, 6 Drawing Sheets

(51) Int. Cl.
*H01J 61/04* (2006.01)
*H01J 61/52* (2006.01)

(52) U.S. Cl.
CPC ........ *G03F 7/70616* (2013.01); *H01J 61/045* (2013.01); *H01J 61/523* (2013.01); *H01J 61/526* (2013.01)

(56) References Cited

U.S. PATENT DOCUMENTS

| | | | |
|---|---|---|---|
| 7,030,958 | B2 | 4/2006 | Luijkx et al. |
| 7,541,604 | B2 | 6/2009 | Goetze et al. |
| 7,901,110 | B2 * | 3/2011 | Mulay ............... H01J 7/26 313/11 |
| 8,035,304 | B2 | 10/2011 | Selezneva et al. |
| 8,259,771 | B1 | 9/2012 | Shchemelinin et al. |
| 8,432,531 | B2 | 4/2013 | Hoekerd et al. |
| 2003/0147499 | A1 * | 8/2003 | Kondo ............... H05G 2/001 378/119 |
| 2006/0066855 | A1 | 3/2006 | Boef et al. |
| 2007/0057610 | A1 | 3/2007 | Allen et al. |
| 2007/0228288 | A1 | 10/2007 | Smith |
| 2010/0109529 | A1 | 5/2010 | Allen et al. |
| 2010/0176310 | A1 * | 7/2010 | Moriya ............... G03F 7/70033 250/493.1 |
| 2010/0264820 | A1 | 10/2010 | Sumitomo et al. |
| 2011/0027704 | A1 * | 2/2011 | Cramer ............... G03F 7/70641 430/30 |
| 2011/0204265 | A1 | 8/2011 | Smith et al. |
| 2011/0234987 | A1 | 9/2011 | Tanaka et al. |
| 2011/0316406 | A1 * | 12/2011 | Boroczki ............... H01J 61/33 313/33 |
| 2012/0229785 | A1 | 9/2012 | Mihailovitch et al. |
| 2012/0242970 | A1 | 9/2012 | Smilde et al. |
| 2013/0003384 | A1 | 1/2013 | Bezel et al. |
| 2013/0106275 | A1 | 5/2013 | Chimmalgi et al. |
| 2013/0181595 | A1 | 7/2013 | Bezel et al. |
| 2013/0329204 | A1 | 12/2013 | Pellemans et al. |
| 2014/0060792 | A1 | 3/2014 | Wang et al. |

FOREIGN PATENT DOCUMENTS

| | | |
|---|---|---|
| JP | 2003-229298 A | 8/2003 |
| KR | 2013-0135393 A | 12/2013 |
| TW | 2011/37412 A1 | 11/2011 |
| TW | 2012/35796 A1 | 9/2012 |
| WO | WO 2009/078708 A1 | 6/2009 |
| WO | WO 2009/106279 A1 | 9/2009 |
| WO | WO 2014/036171 A1 | 3/2014 |

OTHER PUBLICATIONS

International Search Report and Written Opinion of the International Search Authority directed to related International Patent Application No. PCT/EP2014/074660, dated Feb. 6, 2015; 16 pages.

International Preliminary Report on Patentability directed to related International Patent Application No. PCT/EP2014/074660, dated Jun. 14, 2016; 10 pages.

* cited by examiner

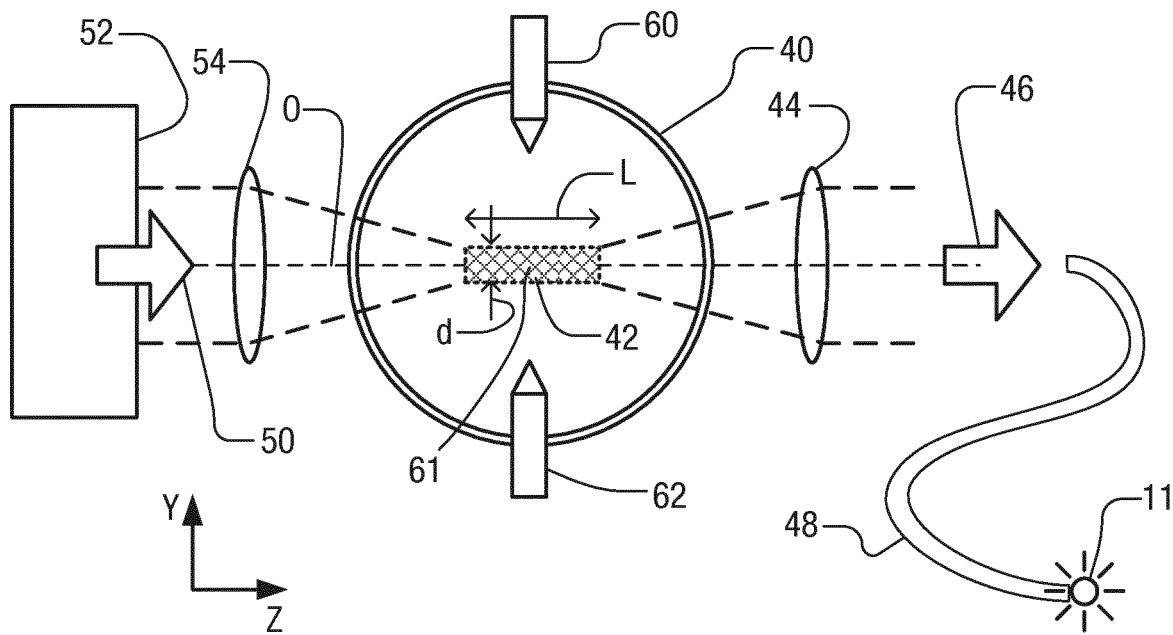
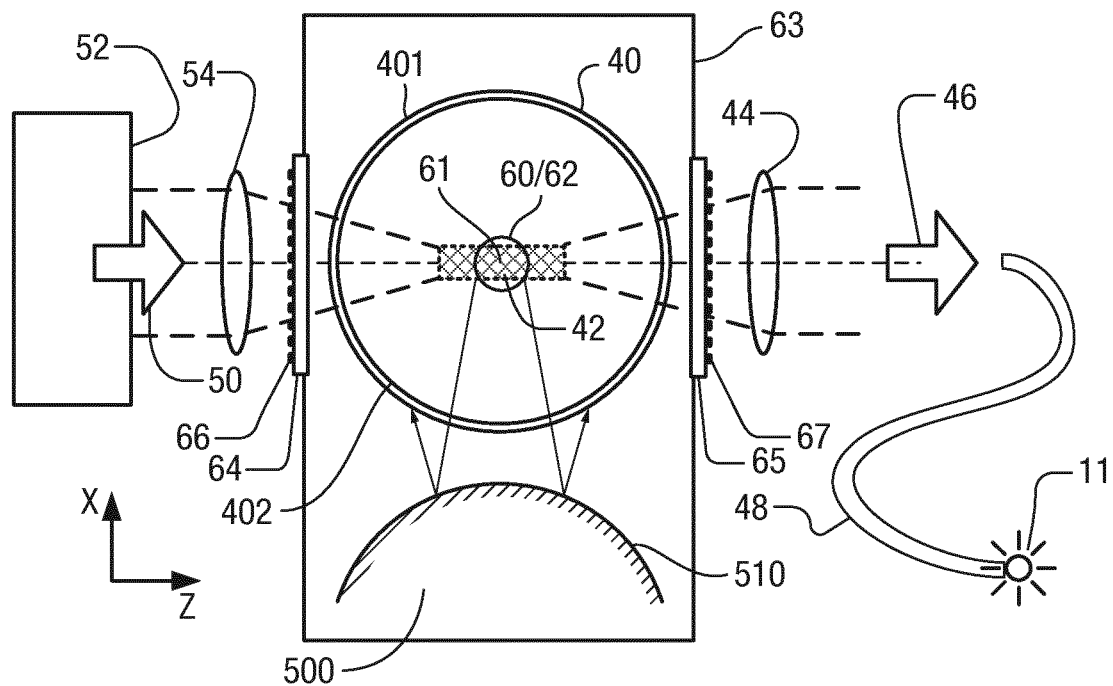

RADIATION SOURCE, METROLOGY APPARATUS, LITHOGRAPHIC SYSTEM AND DEVICE MANUFACTURING METHOD

CROSS-REFERENCE TO RELATED APPLICATIONS

This application claims the benefit of EP application 13197289, which was filed on Dec. 13, 2013 and which is incorporated herein in its entirety by reference.

BACKGROUND

Field of the Invention

The present invention relates to plasma based radiation sources (photon sources). Such sources may be used for example to provide high brightness illumination in methods and for metrology usable, for example, in the manufacture of devices by lithographic techniques and to methods of manufacturing devices using lithographic techniques.

Background Art

Radiation sources according to the invention may find application in a wide range of situations. As an example application, the following will describe use of the invention as a light source in metrology. As a particular field of application of metrology, the following shall refer for the sake of example to metrology in the manufacture of devices by lithography.

The terms 'light' and 'light source' may be used conveniently to refer to the generated radiation and the radiation (or photon) source itself, without implying any limitation to radiation of visible wavelengths.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation. From these measured properties a property of interest of the target can be determined. Examples of scatterometers and techniques can be found in patent applications US 2006/066855 A1, WO 2009/078708, WO 2009/106279, and US 2011/0027704 A.

In one commercially available metrology apparatus, the light source is a xenon (Xe) arc-discharge lamp. Light from this lamp is imaged onto the measurement target through an illumination branch of the apparatus sensor, the last stage of which consists of a high-NA objective. The measurement spot may have a diameter of 25 µm, for example. The time required for each measurement depends in practice on the brightness of the light source at a given wavelength or wave range. Future generations of apparatus are desired to provide an increased spectral bandwidth and sensor design with lower transmittance, while keeping the measurement time the same or shorter. Significant source brightness improvements are necessary to fulfill these requirements.

Plasma-based radiation (photon) sources, for example laser driven light sources (LDLS) offer higher brightnesses. Plasmas are generated in a gaseous medium by the application of energy through electric discharge, and laser energy. The spectral distribution of the radiation may be broadband or narrowband in nature, and wavelengths may be in the near infrared, visible and/or ultraviolet (UV) bands. Published patent application US 2011/204265 A1 discloses plasma based light sources including laser driven light sources. One of the difficulties with LDLS is the short lifetime of the xenon arc-discharge bulbs used.

SUMMARY OF THE INVENTION

In a first aspect of the invention there is provided a radiation source apparatus comprising: a container comprising walls for defining a space for containing a gaseous medium in which plasma which emits plasma emitted radiation is generated following excitation of the gaseous medium by a driving radiation; and a thermal load applicator adapted to apply a thermal load to at least part of the walls of the container to reduce stresses in the walls.

The radiation source may be applied in metrology, for example in lithography. The invention in another aspect provides method of measuring a property of structures that have been formed by a lithographic process on a substrate, the method comprising the steps of:
(a) illuminating said structures using output radiation of a radiation source according to the first aspect of the invention, set forth above;
(b) detecting radiation diffracted by the structures; and
(c) determining from properties of said diffracted radiation one or more properties of the structure.

The invention yet further provides an inspection apparatus for measuring a property of a structure on a substrate, the apparatus comprising:
a support for the substrate having said structure thereon;
an optical system for illuminating the structure under predetermined illumination conditions and for detecting predetermined portions of radiation diffracted by the component target structures under said illumination conditions;
a processor arranged to process information characterizing the detected radiation to obtain a measurement of said property of the structure,
wherein said optical system includes a radiation source apparatus according to the invention as set forth above.

The invention yet further provides a lithographic system comprising:
a lithographic apparatus comprising:
an illumination optical system arranged to illuminate a pattern;

a projection optical system arranged to project an image of the pattern onto a substrate; and an inspection apparatus according to an embodiment of the invention as set forth above, wherein the lithographic apparatus is arranged to use the measurement results from the inspection apparatus in applying the pattern to further substrates.

The invention yet further provides a method of manufacturing devices wherein a device pattern is applied to a series of substrates using a lithographic process, the method including inspecting at least one composite target structure formed as part of or beside said device pattern on at least one of said substrates using the aforementioned method of measuring a property of structures that have been formed by a lithographic process on a substrate, and controlling the lithographic process for later substrates in accordance with the result of the inspection method.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIG. 4 is a schematic diagram of a radiation source used in the apparatus of FIG. 3;

FIG. 5 is a schematic diagram of a radiation source apparatus, according to an embodiment of the present invention;

DETAILED DESCRIPTION OF EXEMPLARY EMBODIMENT

Before describing embodiment of the invention in detail, it is instructive to present an example environment in which embodiments of the present invention may be implemented.

Figure 1:
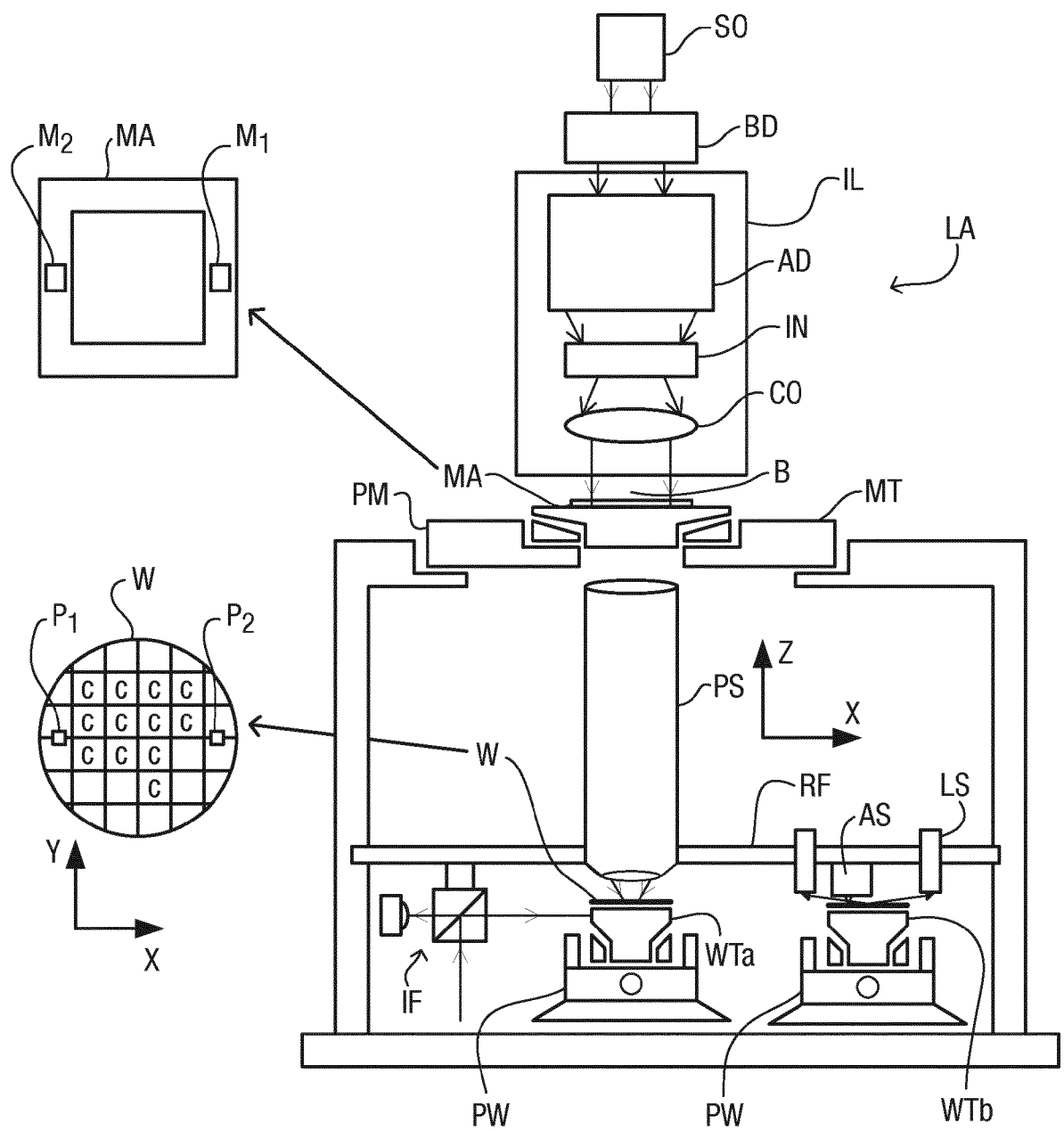
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers, is described further below.

The depicted apparatus could be used in at least one of the following modes:

1. In step mode, the patterning device support (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface level of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Figure 2:
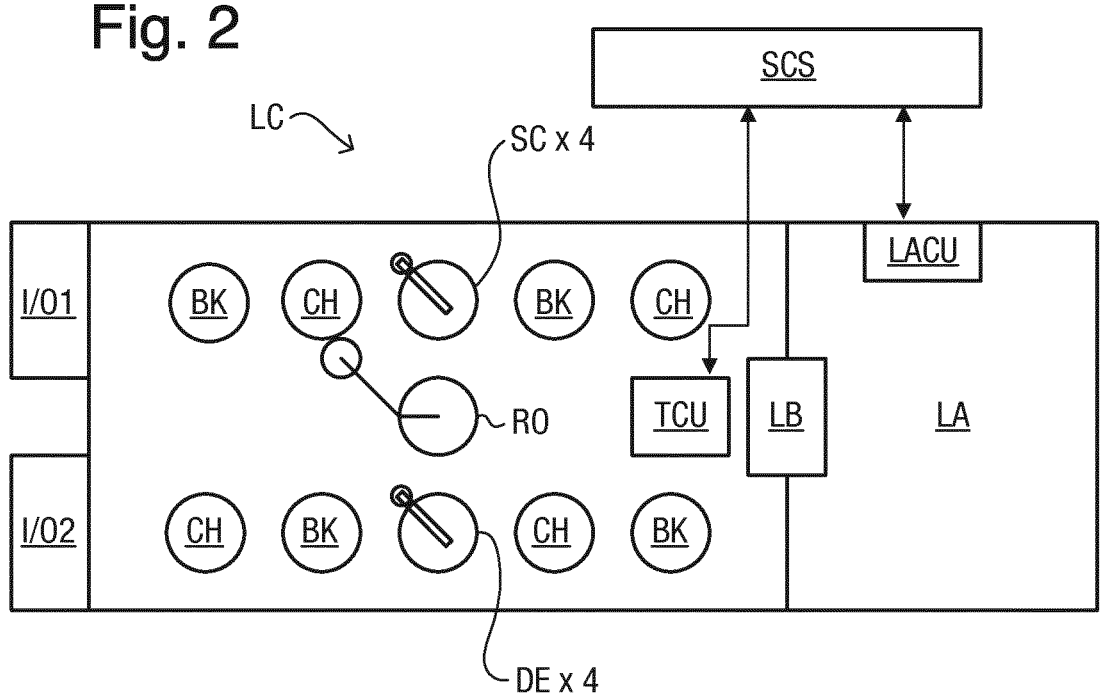
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figure 3:
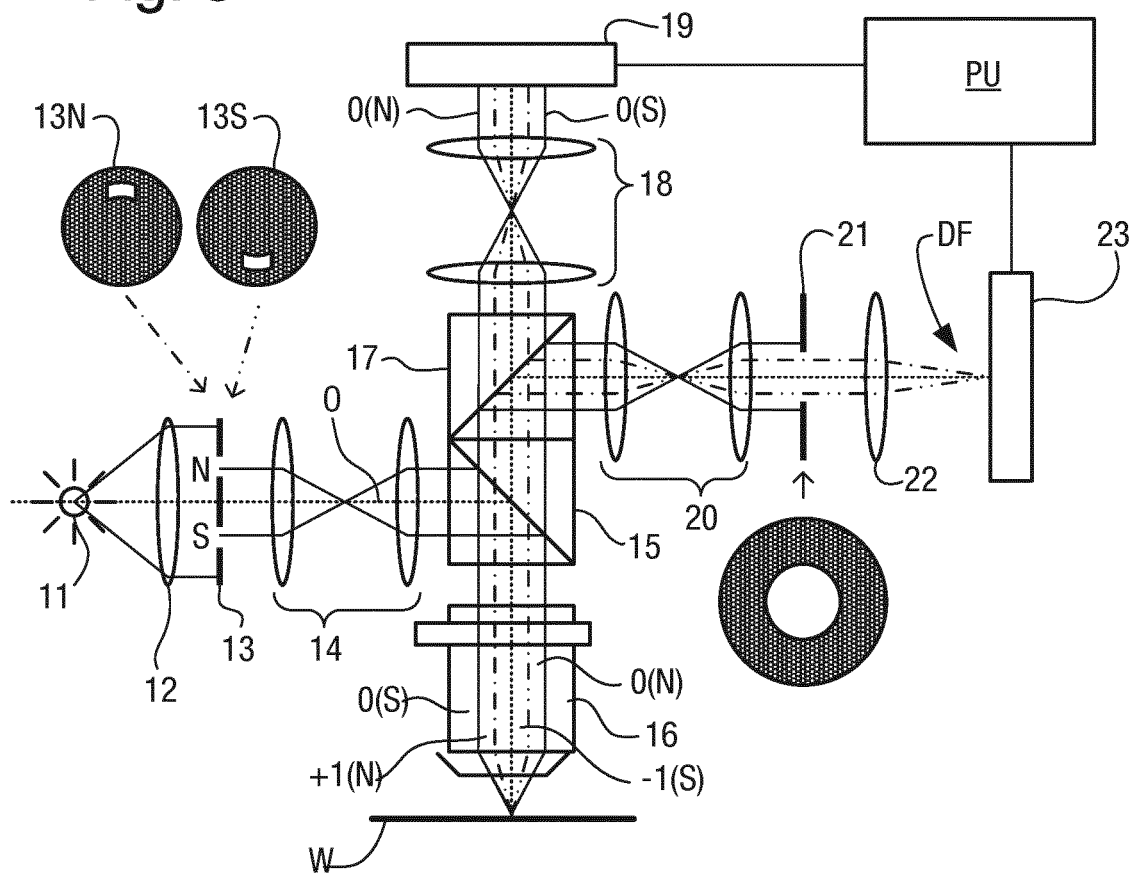
FIG. 3 comprises a schematic diagram of an optical apparatus incorporating a photon source, the apparatus in this example having the form of a scatterometer used in metrology.

FIG. 3 is a schematic diagram of an optical apparatus in the form of a scatterometer suitable for performing metrology in conjunction with the lithocell of FIG. 2. The apparatus may be used for measuring critical dimensions of features formed by lithography, measuring overlay between layers and the like. A product feature or dedicated metrology target is formed on substrate W. The apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 is directed onto substrate W via a beam splitter 15 by an optical system comprising lenses 12, 14 and objective lens 16. These lenses are arranged in a double sequence of a 4F arrangement. A different lens arrangement can be used, provided that it still provides an image of the source on the substrate, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. For example, as illustrated, aperture plate 13 can different forms, two of which are labeled 13N and 13S, allowing different illumination modes to be selected. The illumination system in the illustrated example forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

At least the 0th and one of the −1 and +1 orders diffracted by the target on substrate W are collected by objective lens 16 and directed back through beam splitter 15. A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can be used for many measurement purposes such as reconstruction.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The image detected by sensor 23 is thus referred to as a 'dark-field' image. Note that the term 'image' is used here in a broad sense. An image of the grating lines as such will not be formed, if only one of the −1 and +1 orders is present.

The images captured by sensors 19 and 23 are output to image processor and controller PU, the function of which will depend on the particular type of measurements being performed. More detail of the apparatus and its applications can be found in the prior patent applications mentioned in the introduction above. The present disclosure is concerned with the construction and operation of the light source 11, to provide higher brightness than the Xe arc lamp used in the known apparatus.

FIG. 4 shows schematically the principal components of a laser-driven photon source apparatus i.e. a radiation source. The central component is a first container 40, for example a glass capsule or bulb, containing a predetermined gaseous atmosphere. A suitable gas for example may be xenon (Xe), or a xenon-argon mix. In an embodiment the gas is pressurized, for example between 10 and 30 bar when cold (and about 4 times that when hot). Within this atmosphere, a plasma 42 is generated in a manner to be described, and the plasma emits light (more generally photons of radiation of the desired wavelengths). Collection optics 44 form a beam 46 of the radiation that is coupled to a optical fiber 48. Fiber 48 delivers the radiation to the point where it is needed. When the photon source is used as the source in the apparatus of FIG. 3, the end of fiber 48 forms the source 11 seen in FIG. 3. Collection optics 44 is shown here as a simple lens, but can of course be more complex in practical embodiment. Reflective rather than refractive optics may be used.

Plasma 42 in this embodiment is generated by application of drive radiation 50 which is generated in this example by a laser 52. Drive optics 54 focus the laser which reaches its narrowest point at the location where the plasma 42 is desired to be formed and maintained. The laser 52 may be one of a number of different types of high power laser available today or in future. It may for example be a Nd:YAG laser, a CO2 laser, a diode laser, a fiber laser. Drive optics 54 is shown here as a simple lens, but can of course be more complex in practical embodiment. Reflective rather than refractive optics may be used. Further components may be provided to condition the laser radiation in its profile or spectral characteristics. A beam expander may be used, for example.

The laser radiation may be for example in infrared wavelengths, such as 700 to 2000 nm. The plasma will typically generating radiation at shorter wavelengths in the infrared, visible and/or ultraviolet bands, for example down to 200 nm or below. Among this plasma radiation are the desired wavelengths for use in the metrology apparatus or other application. Filter components may be provided in the optical path, for example to reduce the amount of infrared radiation entering collection optics 44 and/or fiber 48. Such filters can be placed inside and/or outside first container 40. They may also be integrated with the first container wall, and/or with other components of the collection optics 44.

Laser energy 50, although very narrowly focused, is not necessarily sufficient to ignite the plasma from a cold start, and electrodes 60 and 62 are provided with appropriate power and control circuitry (not shown), in order to ignite the plasma. These electrodes may be similar to those used in a conventional gas discharge lamp, but are used only during a start-up phase of operation.

In the diagram, axes X, Y and Z are defined for the sake of this description. The Z axis is aligned with an optical axis O. The Y direction is aligned with the electrodes 60, 62. The X axis is transverse to the electrodes, and normal to the plane of the diagram. The apparatus can be constructed or mounted with these axes in any orientation that is convenient for its application. Note that there is no component obstructing the optical path from the plasma 42 to the collection optics in the Z direction. There is also in this example nothing obstructing the path of light in the X direction (not shown in this view).

It will be noted that plasma 42, or at least the region of the plasma from which the desired radiation is taken, may be elongate in form, having approximately the shape of a cylinder, or cigar. We will refer to the shape as cylindrical for the sake of explanation. The length of the cylinder is L and its diameter is d. The real plasma will comprise a cloud of elongate form, centered on this cylindrical region. Collection optics 44 is arranged with its optical axis O aligned with the longitudinal direction of the plasma, that is the Z direction in this example. The area of the plasma thus appears as $\pi d^2/4$, that is the area of one end of the cylinder. When L is made substantially greater than d, the depth of plasma from which photons can enter the collection optics through this small area is greater, compared with looking at the plasma in a transverse direction. This allows a higher brightness to be seen over that area, for a given size and intensity of plasma. The etendue of an optical source (or receiver) is broadly speaking the product of the area of the source (receiver) and its exit (entrance) angle. The etendue of the collection optics 44, as with any imaging system, is the product of spot size times the square of its numerical aperture (NA2). The NA in turn is determined by the entrance angle θ. The etendue of the radiating plasma is in general going to be larger than the etendue of the collection optics 44. Collection optics 44 may be focused at a hypothetical source point 61 midway along the cylinder, as illustrated. In practical examples, the length L of light emitting plasma region 42 may be on the order of a millimeter, say 0.5 to 5 mm. The diameter d may be much smaller, in the range of say 0.01 to 2 mm, for example 0.1 to 1 mm.

In practice, the plasma absorbs very little of the wanted radiation, so that photons emitted anywhere along the length L of the cylinder can travel in the entrance cone of collection optics 44 and into fiber 48. Therefore, compared with the transverse direction, the plasma appears brighter (greater luminous flux per unit area per unit solid angle) than when viewed in the transverse direction. Whereas some laser driven light sources, such as described in US 2011/204265 A1, seek to capture light emitted in the transverse direction, the photon source illustrated herein captures light emitted in the longitudinal direction to exploit the enhanced brightness and smaller extent of the plasma. Either capturing arrangement can be used in combination with the novel concepts disclosed herein.

FIG. 5 shows a photon source apparatus according to an embodiment of the invention. Note that plasma generation/excitation and collection/transport of the subsequent radiation follow the same structure and process as previously described in relation to FIG. 4. FIG. 5 is a view taken from a direction orthogonal to that used in FIG. 4. FIG. 4 is a plan view of the radiation source. FIG. 5 is a side view with an upper wall 401 of the container 40 and a lower wall of the container 402. The electrodes 60, 62 protrude out of a side wall of the container 40. However, other arrangements are possible, for example where the electrodes protrude out of the upper and lower walls 401, 402 or at other positions of the container 40.

FIG. 5 shows a second container 63 enclosing a radiation source represented, in this example, by the laser-driven photon source described above (i.e. first container 40, electrodes 60, 62 and appropriate power and control circuitry (not shown)). Second container 63 is an airtight (hermetically sealed) container, which may enclose an atmosphere of air, or any other fluid that has the desired optical properties. Second container 63 also comprises at least one light transmitting element, e.g. light transmitting windows 64, 65, and, at least one filter component, e.g. filter components 66, 67. It should be appreciated that the photon source does not necessarily have to take the form of that depicted and may take any other suitable form.

Drive radiation 50 may be focused by focusing optics 54 onto plasma 42, entering the second container 63 via window 64. Light generated by plasma 42 may exit the second container 63 via window 65, to be collected by collection optics 44. Filter components 66 block ultraviolet radiation exiting the second container 63 through window 64. Filter components 67 may also block ultraviolet and infrared radiation exiting second container 63 through window 65.

Windows 64 and 65 should be airtight and made of suitable coated/uncoated materials. The windows may also be any size, shape or thickness and/or may be flat/curved. Similarly, filter components 66, 67 may be provided in the optical path and made of suitable materials with variable thickness, fixed by the required wavelengths. The filters can be placed inside and/or outside second container 63. Filters 66, 67 may be integrated with the windows 64, 65, for example they may comprise coating layers on windows 64, 65. Filter components 67 may also be integrated with other components of the collection optics 44.

Collection optics 44 may be placed inside second container 63. In this configuration, the light may exit second container 63 through fiber 48 connected to second container 63.

Airtight second container 63 and contents may be assembled in any relatively clean environment, e.g. in a typical laboratory environment, and is not required to be assembled in a cleanroom. The second container 63 need only be filled with air and does not necessarily need filling with an inert gas. Air has the advantage of being the cheapest fluid and also is the easiest to handle. However, if other fluids are used, the hermetic seal provides protection from chemical contamination entering from outside of the second container.

The walls of airtight second container 63 may be made of suitable materials which are able to block unwanted radiation (or all radiation), for example, materials which block UV radiation generated by the enclosed photon source. Furthermore, second container 63 may be of any dimension, shape and wall thickness to meet the application requirements.

Since the second container 63 is airtight, and providing that ultraviolet light is filtered out from the output radiation 46 (for example at windows 64, 65), ozone produced by the ultraviolet light remains encapsulated in second container 63. In addition, because of the second container 63 is airtight, no extra chemicals can be enter the second container 63 during the lifetime of the photon source.

In one embodiment, the first container 40 and the second container 63 comprise a single replaceable unit, which can be replaced on failing in a similar manner to bulb replacement (i.e. replacement of container 40) in an apparatus such as that depicted in FIG. 4.

The use of the radiation source apparatus of FIG. 5 dispenses with the need to purge systems, or the use of ozone-free lamps having a shorter lifetime than other lamps. The first container 40 instead simply transmits most or all of the ultraviolet radiation generated by the plasma. Consequently, costs are significantly reduced and efficiency improved.

A difficulty with both of the radiation sources of FIGS. 4 and 5 is that the container 40 used is usually a xenon arc bulb designed to be used for generation of a plasma in the xenon by ionizing the xenon in an electric field generated between the electrodes 60, 62. In the case of the operation as a laser-driven photon source as in FIGS. 4 and 5, the operating conditions are somewhat different than when the container 40 is used in a process in which plasma 42 is produced by an electric arc. In particular, during normal arc operation a large part of any heat generated in the plasma 42 is transported out of the container 40 through heat conduction in the electrodes 60, 62. However, when the container 40 is part of a laser-driven photon source apparatus, such as in FIGS. 4 and 5, the volume taken up by the plasma 42 is much less. The plasma does not extend up to the electrodes 60, 62. As a result, heat transfer out of the container 40 via electrodes 60, 62 is a lot lower than during arc operation.

In laser-driven photon source mode, heat produced in the plasma 42 is partly removed by radiation and partly by convection of the gas (e.g. xenon) within the container 40. This convection causes the upper wall 401 of the container 40 to become hotter than the lower wall 402. As a result a large thermal gradient is set up in the walls of the container. The container 40 is not designed to accommodate such a large thermal gradient. The large thermal gradient can lead to high thermally induced stresses in the wall of the container 40 and result in early failure. Although this difficulty exists in the embodiment of FIG. 4, the effect is greater in the embodiment of FIG. 5. This is because convection within the second container 63 can exacerbate the problem by further cooling the lower wall 402 of the container 40 compared to the upper wall 401 of the container 40.

The present invention addresses the problem of thermal stresses set up in the container 40 by providing a thermal load applicator 500. The thermal load applicator 500 is illustrated as being part of the embodiment of FIG. 5. However, the radiation source of FIG. 4 could also be provided with a thermal load applicator as herein described.

In an embodiment the thermal load applicator 500 is positioned outside of the first container 40. In an embodiment the thermal load applicator is positioned within the second container 63.

The thermal load applicator 500 is adapted to apply a thermal load to at least part of the walls of the container 40. The thermal load which is applied by the thermal load applicator 500 reduces stresses in the walls of the container 40 in use. The thermal stresses may be induced by anisotropic heating of the walls, for example due to convection in the gaseous medium within the container 40. Another example of the origin of stresses in the walls of the container 40 may be due to the manufacturing technique for making the container 40. For example, a protrusion is sometimes left at a location in the walls of the container 40 at which location gas is introduced into the container. The protrusion has a larger surface area than other parts of the walls of the container and so in use can cool down faster. The thermal load applicator 500 reduces stresses in the walls of the container 40 by reducing the difference in temperature between different parts of the walls of the container 40 (e.g. between the upper and lower 401, 402 walls) and/or by promoting a temperature distribution in the walls of the container 40 similar to the temperature distribution during use as an arc discharge bulb. The thermal load applicator 500 counteracts the anisotropic heating of the walls of the container 40. The thermal load applicator 500 compensates for the convective heating of the top of the container 40.

Several different embodiments of thermal load applicator 500 are described hereinafter. The thermal load is applied with a magnitude and/or direction (either a cooling load or a heating load) and/or to a (predetermined in some embodiments) part of the walls of the container in order to reduce thermal stresses within the walls of the container 40. In an embodiment this has the effect of making the total heat load (e.g. including heat load directly or indirectly due to the plasma 42 and gas within the first and/or second container 40, 63 as well as due to the thermal load applicator 500) applied to each part of the walls of the container 40 closer to an average of heat load applied to the walls of the container 40. In an embodiment, the thermal load applicator 500 applies a (positive) heat load to a protrusion in the walls of the container 40 at which location gas is introduced into the container 40 during manufacture.

Figure 6:
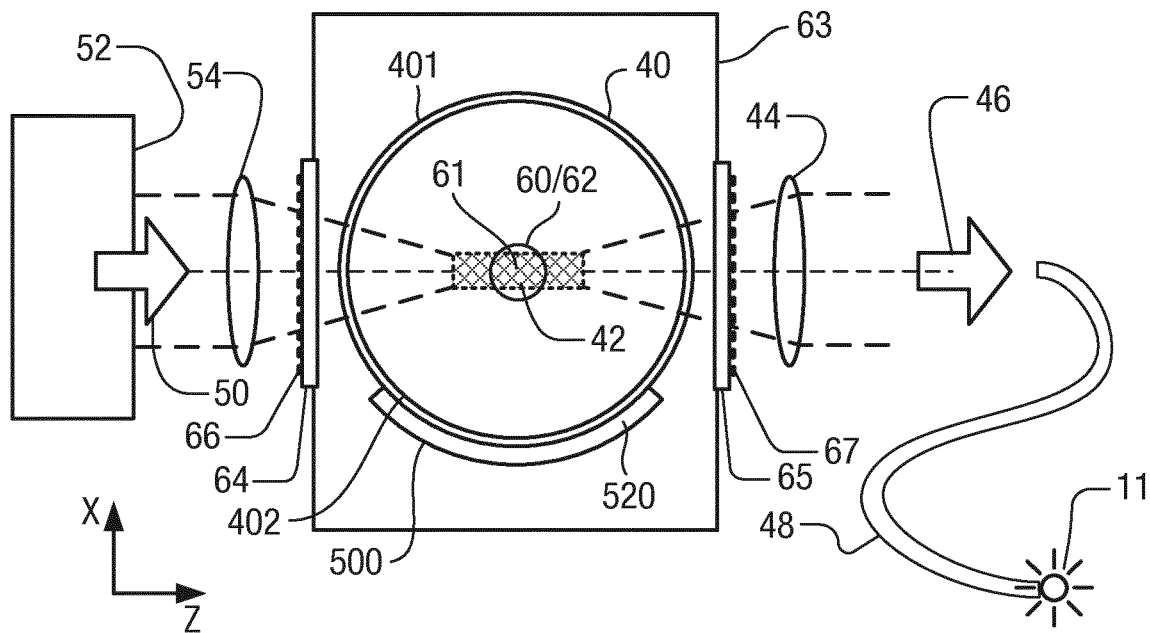
FIG. 6 is a schematic diagram of a radiation source used in the apparatus of FIG. 3 according to a second embodiment of the present invention.

The embodiments of FIGS. 5 and 6 illustrate embodiments of a thermal load applicator 500 which is a passive component. This has the advantage that no moving parts are necessary and no control system needs to be adopted for their use.

In the embodiments of FIGS. 7-10, the thermal load applicator 500 is an active component. These components may be controlled, for example in a feedback loop. In an embodiment the feedback loop is based on a desired target temperature of a part of the wall of the container 40. In an embodiment the thermal load applicator 500 is controlled by a feedforward control loop (for example based on the operating conditions of the electrodes 60, 62 and/or laser 52). Control of the thermal load applicator 500 is advantageous because more control can be exercised over the magnitude of the heat load applied and optionally on which part of the walls of the container 40 that heat load is applied to than in the passive embodiments. This can result in an even longer lifetime of the container 40, at the expense of increased complexity.

In an embodiment the thermal load applicator 500 is adapted to heat at least part of the walls of the container 40. This is the case in the embodiments of FIGS. 5-8 and 10. In an embodiment the thermal load applicator 500 is adapted to cool at least part of the walls of the container 40. Such an embodiment is illustrated in FIG. 9.

The thermal load applicator 500 may comprise one or more different ways of applying a heat load. For example, any of the described embodiments may be combined with one another in any combination. For example, the thermal load applicator 500 may comprise the features of all of the embodiments of FIGS. 5-10.

In the embodiment of FIG. 5 the passive thermal load applicator 500 comprises a reflector 510. In an embodiment the reflector 510 is adapted to reflect at least part of the radiation emitted from the container 40, in particular from the plasma 42, back towards the walls of the container 40. The radiation is reflected to the lower wall 402 has a higher flux than that reflected to the upper wall 401. Thereby a greater heat load is applied to the lower wall 402 than to the upper wall 401. As a result, the thermal load applicator 500 in the form of the reflector 510 warms the lower wall 402 more than the upper wall 401 and thereby reduces the temperature difference between the upper and lower walls 401, 402. As a result, stress in the walls induced by anisotropic heating of the walls resulting from convection in the gaseous medium within the container 40, is reduced.

In an embodiment the reflector 510 (which may be in the form of a mirror) may be effective to reflect all wavelengths of radiation emitted by the plasma 42. In some embodiments the reflector 510 may only reflect certain wavelengths (for example, one or more of UV light, visible light and infrared light).

In the embodiment illustrated in FIG. 5 the reflector 510 is convex. The reflector 510 is positioned below the container 40. However, this is not necessarily the case and a flat reflector or even a concave reflector may be used. In an embodiment the focus point of the reflector is nearer the lower wall 402 of the container 40 than the upper wall 401. This ensures that the lower wall 402 receives a higher radiation flux than the upper wall 401. In an embodiment, the reflector 510 may be positioned above the container 40.

In an embodiment, the reflector 510 (or an additional reflector) is present for reflecting radiation towards a protrusion in the walls of the container 40 at which location gas is introduced into the container 40 during manufacture. The reflector may be concave for this purpose to focus the reflected radiation onto the protrusion.

Another embodiment is illustrated in FIG. 6. The embodiment of FIG. 6 is the same as that of FIG. 5 except as described below. In FIG. 6 the thermal load applicator 500 is also a passive thermal load applicator. In the FIG. 6 embodiment the thermal load applicator is in the form of a coating 520. The coating 520 is formed on at least part of the lower wall 402 of the container 40. The coating 520 is made of a substance which absorbs radiation emitted by the plasma 42. A material which absorbs UV light (e.g. a material used in a UV filter) can be used for the coating. As a result of absorbing radiation emitted by the plasma 42, the coating 520 warms up. Conduction between the coating 520 and the lower wall 402 results in the lower wall 402 being heated up by the coating 520.

In an embodiment the coating 520 is applied only to certain parts of the walls of the container 40. For example, the coating 520 is only applied to those parts of the walls of the container which require a heat load to be applied to them in order to reduce the difference in temperature between those parts of the wall and the hottest parts of the wall. The coating 520 may be applied on only part of the lower wall 402. The coating 520 may not be applied on all of the lower surface 402 or may be applied to other surfaces of the walls of the container 40 than the lower wall 402.

In an embodiment the thickness of the coating 520 varies from part of the wall of the container 40 to another. A thicker coating 520 will absorb more of the radiation from the plasma 42 and thereby get hotter than a thinner coating 520. As a result, it is possible to tune the heat load applied to different parts of the wall of the container 40 by varying the presence or absence of a coating 520 and by varying the thickness of the coating 520 from one place to another.

Figure 7:
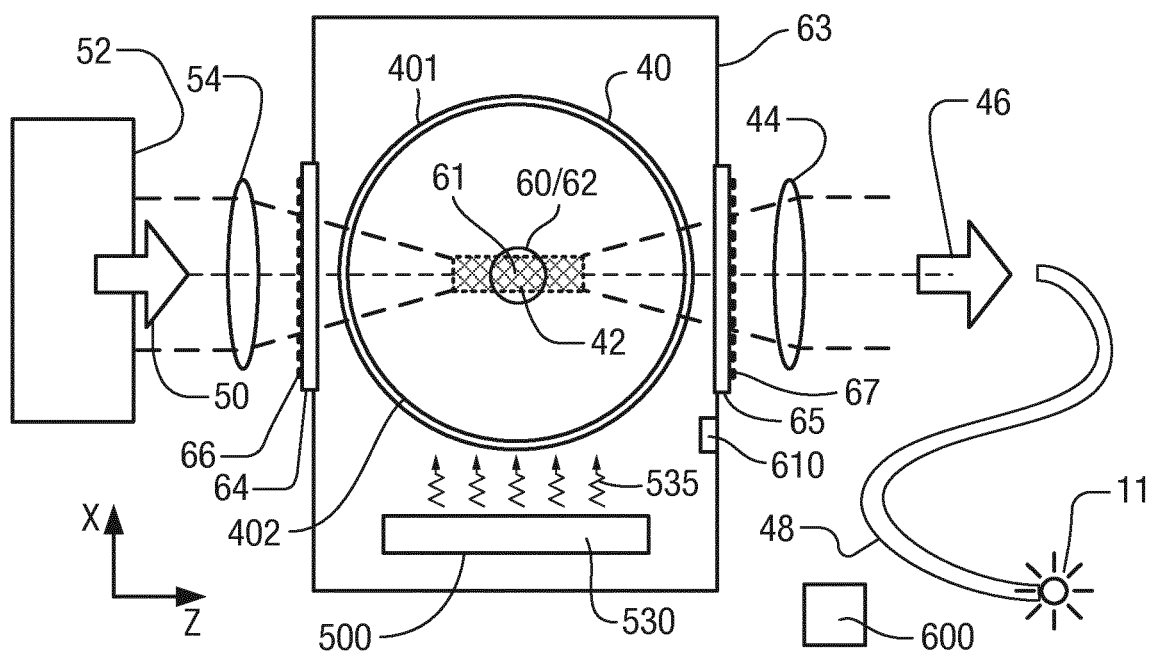
FIG. 7 is a schematic diagram of a radiation source used in the apparatus of FIG. 3 according to a third embodiment of the present invention.

FIG. 7 illustrates an embodiment which is the same as the embodiment of FIG. 5 except as described below.

In the embodiment of FIG. 7, the thermal load applicator 500 is in the form of a heater 530. In an embodiment the heater 530 is adapted to heat the lower wall 402 of the container 40 more than the upper wall 401 of the container.

The heater 530 of the FIG. 7 embodiment is a radiation source. The heater 530 emits radiation 535 of a wavelength effective to heat the lower wall 402 of the container 40. The flux from the heater 530 is greater at the lower wall 402 than at the upper wall 401. As a result, the lower wall 402 of the container 40 may have its temperature raised by the heater 530 more than the upper wall 401. As a result the temperature difference between the upper and lower walls 401, 402 of the container 40 is reduced.

In an embodiment a controller 600 is provided for controlling the heater 530. For example, the controller 600 may receive a signal from a (contactless) temperature sensor 610 which detects the temperature of at least one part of the wall of the container 40. In one embodiment, the temperature sensor 610 measures the temperature of the lower wall 402. On the basis of a signal from the temperature sensor 610 and a predetermined set value (or a input relating to the temperature a different part of the wall (e.g. the upper wall 401)), the controller 600 controls the heater 530. In an embodiment, a comparator of the controller 600 can compare the temperatures of the upper and lower walls 401, 402 and regulate the power of the heater 530 to reduce the difference in temperature between upper and lower walls 401, 402 to a predetermined level.

In an embodiment, the controller 600 can actively control which part of the walls of the container 40 the heater 530 irradiates and/or control the heater 530 to irradiate different parts of the walls with different levels of flux.

Figure 8:
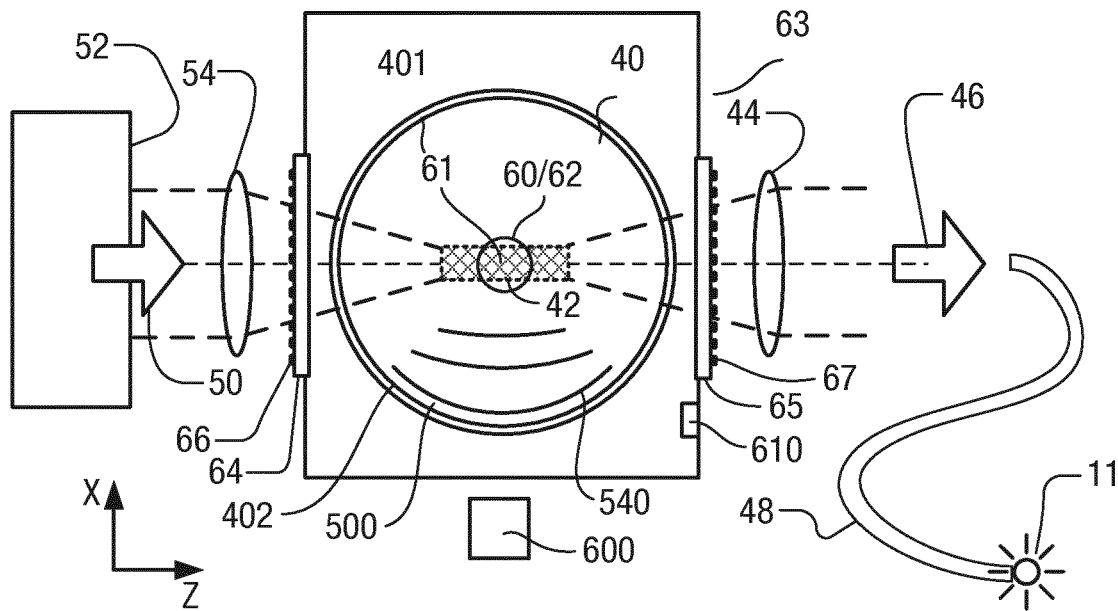
FIG. 8 is a schematic diagram of a radiation source used in the apparatus of FIG. 3 according to a fourth embodiment of the present invention.
Figure 9:
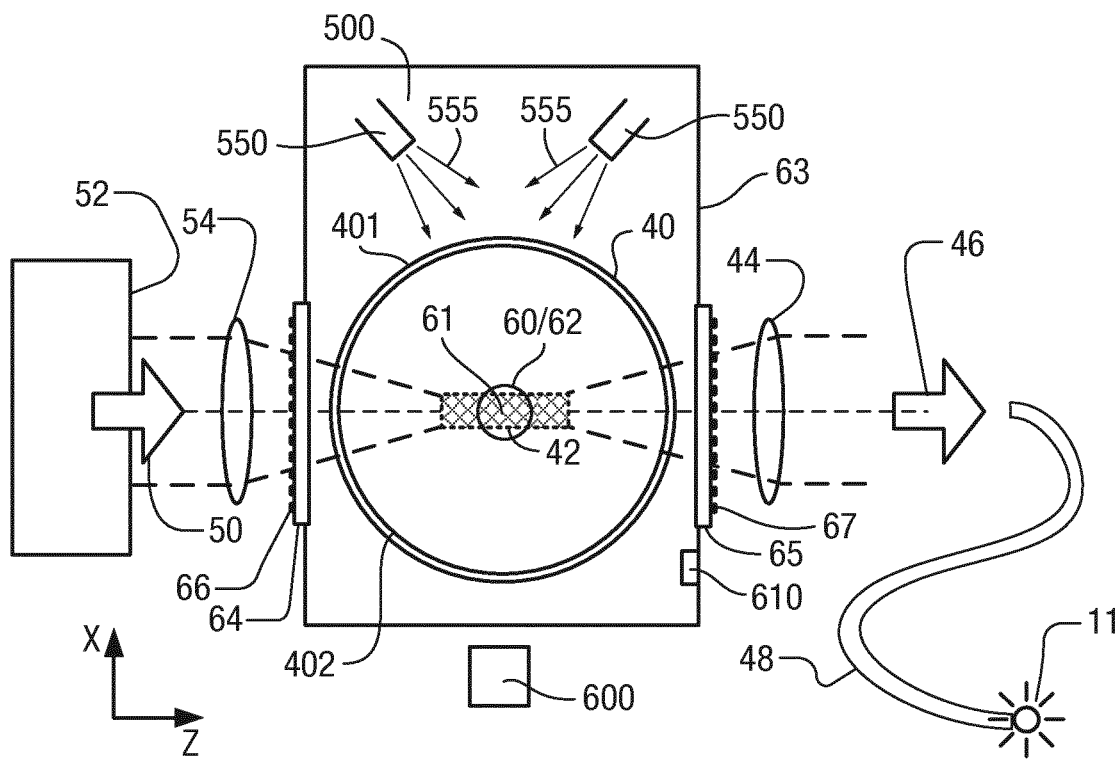
FIG. 9 is a schematic diagram of a radiation source used in the apparatus of FIG. 3 according to a fifth embodiment of the present invention.

The embodiment of FIG. 8 is the same as the embodiment of FIG. 7 except as described below. In the embodiment of FIG. 8 the thermal load applicator 500 takes the form of a heater 540. In contrast to the embodiment of FIG. 7, in the embodiment of FIG. 8 the heater 540 takes the form of one or more wires or lines through which electricity is passed in order to heat them up. Therefore, the heater 540 heats the lower wall 402 of the container 40 through conduction. In an embodiment the heater 540 is an electrical resistance heater.

Any pattern of lines of heater 540 may be applied to the walls of the container 40. As with the embodiment of FIG. 7 a controller 600 may control the heater 540. Like with the embodiment of FIG. 7 the controller 600 may control the heater 540 such that only certain parts of the wall of the container 40 are heated at any given time. The embodiment of FIG. 8 is particularly suited to this type of control. This is because each of the individual wires or lines can be controlled individually by passing current or not through them and/or by varying the amount of current passing through them and thereby the temperature which they and the wall of the container 40 at their location reach.

The embodiment of FIG. 9 is the same as that of the embodiment of FIG. 7 except as described below. In the embodiment of FIG. 9 the thermal load applicator 500 is adapted to cool at least part of the walls of the container 40. In the embodiment of FIG. 9 the thermal load applicator 500 comprises one or more nozzles 550 from which a gas flow 555 emanates. In the embodiment of FIG. 9 a gas flow 555 is used to provide a cooling gas flow over the upper wall 401 of the container 40. The gas of the gas flow 555 is cooler than the temperature of the upper wall 401 of the container 40 and thereby cools it. By cooling the upper wall 401 with a cooling load which is higher than any cooling load applied to the lower wall 402 of the container 40, the temperature of the upper wall 401 is reduced more than that of the lower wall 402 and thereby the difference in temperature between upper wall 401 and lower wall 402 is reduced.

In an alternative embodiment the thermal load applicator 500 which is adapted to cool at least part of the walls of the container 40 can take the form of a fan directing a gas flow at the upper wall 401. Controller 600 may be used in the same or a similar way as described for the other embodiments.

Figure 10:
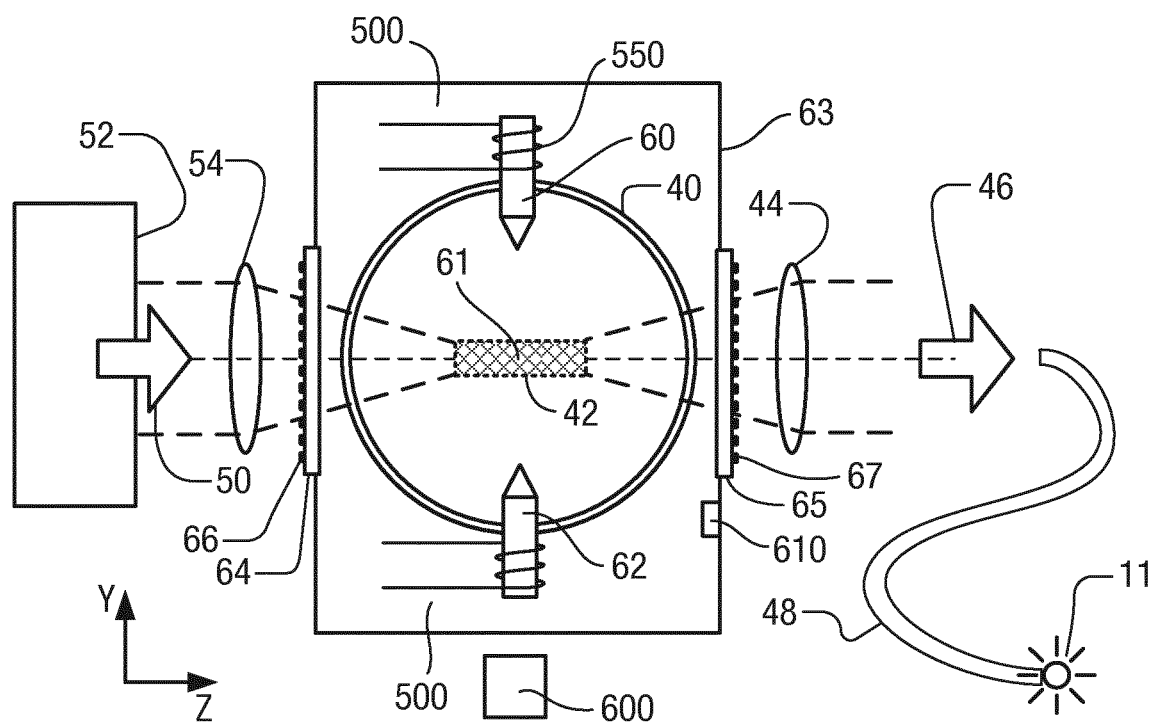
FIG. 10 is a schematic diagram of a radiation source used in the apparatus of FIG. 3 according to a sixth embodiment of the present invention.

The embodiment of FIG. 10 is the same as that of the embodiment of FIG. 7 except as described below. FIG. 10 is a top view of the apparatus (like FIG. 4). In the FIG. 10 embodiment the thermal load applicator 500 is in the form of a heater 560 positioned around each of the electrodes 60, 62. The idea of this embodiment is to change the thermal load applied to the container 400 such that it is more similar to the thermal load experienced by the container 40 when it is being driven as a xenon arc bulb. During use in arc operation, a large part of the heat of the plasma 42 is transported out of the container 40 through the electrodes 60, 62. Therefore, by heating up the electrodes 60, 62 when operating as a laser-driven photon source, the temperature profile of the walls of the container 40 approximate that during arc operation. As a result, the temperature profile of the walls of the container 40 is closer to that for which the container 40 is designed and failure is less likely to occur. The heaters 560 mainly heat metal parts of the apparatus. The heaters 560 may be electrical resistance heaters. Alternatively the heaters may be an inductive heater which induces a current in metal parts of the electrodes 60, 62 and thereby heats them.

It is common for design measures to be taken to try and reduce the length L of the plasma to concentrate its power in a smaller length, the constraints on the plasma shape in the source are relatively relaxed. Whereas, in some prior examples in, the plasma extends longitudinally in what is depicted as the Y direction, between the igniting electrodes, in the illustrated source the plasma in normal operation is arranged so that rays in the longitudinal direction are not obscured, and can be captured by the collection optics 44. Similarly, while in other prior examples the plasma extends in what is depicted as the Z direction, this is obscured by the driving laser optics, and the usable light is captured by a curved mirror, after being emitted in the X and Y directions from the plasma. Thus many prior examples rely on capturing the photons emitted transversely from the plasma. Embodiments of the invention may also or alternatively rely on capturing the photons emitted transversely from the plasma.

It should be noted that the intensity profile of the radiation emitted by the plasma source might not be perfectly uniform across the field of view of collection optics 44. While constraints on the plasma dimensions are relaxed as described above, still the entrance NA of collection optics 44 should be reasonably uniformly filled with radiation. The larger the aspect ratio L/d of the plasma, the smaller the etendue will be in which the radiation is uniformly distributed. Mixing of the light to make it more homogeneous may be desired, for example when the photon source apparatus is used to deliver a homogeneous light field across aperture 13 in the apparatus of FIG. 3. Sufficient mixing may occur naturally within the fiber 48, or additional measures may be taken. Also, optical properties of the walls of the first container 40 should be good enough at the key locations that they do not degrade the quality of the drive laser beam or the pencil of rays emanating from plasma 42 to collection optics 44. Optical properties of the first container wall, as well as windows 64, 65 and filters 66, 67, should of course be taken into account in designing and setting up the collection optics 44 and focusing optics 54. Functional elements of collection optics 44 and focusing optics 54 can be placed inside first container 40 if desired, and/or may be integrated with the wall of the first container.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. As already mentioned, the invention may be applied in industrial processing applications quite separate from lithography. Examples might be in production of optical components, automotive manufacture, construction—any number of applications where object data exists in the form of measurements made with a certain spatial distribution over the product. As in the example of lithography. the set of measurements that is subjected to multivariate analysis can be measurements made for different product units, and/or different instances of measuring the same product units. Although specific reference may have been made above to the use of embodiments of the invention in the context of optical lithography, it will be appreciated that the invention may be used in other types of lithography, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams. As mentioned above, the term radiation in the context of the driving system may also encompass microwave radiation.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiment, but should be defined only in accordance with the following claims and their equivalents.

The invention claimed is:

1. A radiation source apparatus comprising:
    a container comprising a first wall portion and a second wall portion that define a space configured to contain a gaseous medium in which radiation emitting plasma is generated following excitation of the gaseous medium by a driving radiation; and
    a thermal load applicator configured to apply a thermal load to the first wall portion to reduce a thermal gradient between the first wall portion and the second wall portion, thereby reducing stresses in the first and second wall portions.

2. The radiation source apparatus of claim 1, wherein the thermal load applicator is configured to heat the first wall portion.

3. The radiation source apparatus of claim 1, wherein the thermal load applicator is a passive component.

4. The radiation source apparatus of claim 1, wherein the thermal load applicator comprises a reflector for reflecting part of the radiation emitted from the container back to the first wall portion.

5. The radiation source apparatus of claim 4, wherein:
    the first wall portion is lower than the second wall portion; and
    the reflector has a focus point nearer to the first wall portion than the second wall portion.

6. The radiation source apparatus of claim 4, wherein the reflector is convex.

7. The radiation source apparatus of claim 1, wherein the thermal load applicator comprises a coating on the first wall portion which absorbs plasma emitted radiation thereby heating up the first wall portion.

8. The radiation source apparatus of claim 1, wherein the load applicator is an active component.

9. The radiation source apparatus of claim 1, wherein the thermal load applicator is a heater.

10. The radiation source apparatus of claim 9, wherein:
    the first wall portion is lower than the second wall portion; and
    the heater is configured to heat the first wall portion more than the second wall portion.

11. The radiation source apparatus of claim 9, wherein the heater is a radiation source.

12. The radiation source apparatus of claim 9, wherein the heater heats the first wall portion by conduction.

13. The radiation source apparatus of claim 12, wherein the heater is an electrical resistance heater.

14. The radiation source apparatus of claim 9, further comprising:
    two or more electrodes positioned in the space on opposite sides of a plasma forming location within the container for use in igniting the plasma, and
    wherein the heater is configured to heat the electrodes and the first wall portion through conduction of heat from the heated electrodes to the first wall portion.

15. The radiation source apparatus of claim 14, wherein the heater is an induction heater.

16. The radiation source apparatus of claim 1, wherein the thermal load applicator is configured to cool the first wall portion.

17. The radiation source apparatus of claim 16, wherein:
    the first wall portion is higher than the second wall portion; and
    the thermal load applicator is configured to direct a flow of gas against the first wall portion, thereby applying a cooling load to the first wall portion.

18. The radiation source apparatus of claim 1, further comprising:
    a driving system configured to generate the driving radiation and to form the driving radiation into at least one beam focused on a plasma forming location within the container, and
    a collecting optical system configured to collect plasma emitted radiation and forming the plasma emitted radiation into at least one beam of radiation.

19. The radiation source apparatus of claim 18, wherein the driving system comprises at least one laser for generating the driving radiation.

20. The radiation source apparatus of claim 18, wherein:
    the driving radiation comprises a first range including infrared wavelengths, and
    the plasma emitted radiation comprises a second range, different from the first range, including at least one of visible radiation and ultraviolet radiation.

21. The radiation source apparatus of claim 18, wherein the collecting optical system is configured to collect radiation emitted plasma in a longitudinal direction of the plasma.

22. The radiation source apparatus of claim 1, further comprising a second container defining a space configured to contain the container and the thermal load applicator.

23. An inspection apparatus for measuring a property of a structure on a substrate, the apparatus comprising:
    a support for the substrate having the structure thereon;
    an optical system configured to illuminate the structure under predetermined illumination conditions and to detect predetermined portions of radiation diffracted by the component target structures under the illumination conditions; and
    a processor arranged to process information characterizing the detected radiation to obtain a measurement of the property of the structure,
    wherein the optical system includes a radiation source apparatus comprising:
        a container comprising a first wall portion and a second wall portion defining a space configured to contain a gaseous medium in which radiation emitting plasma is generated following excitation of the gaseous medium by a driving radiation; and
        a thermal load applicator configured to apply a thermal load to the first wall portion to reduce a thermal gradient between the first wall portion and the second wall portion, thereby reducing stresses in the first and second wall portions.

24. A lithographic system comprising:
    a lithographic apparatus comprising:
        an illumination optical system arranged to illuminate a pattern;
        a projection optical system arranged to project an image of the pattern onto a substrate; and
        an inspection apparatus for measuring a property of a structure on a substrate, the apparatus comprising:

a support for the substrate having the structure thereon;

an optical system configured to illuminate the structure under predetermined illumination conditions and to detect predetermined portions of radiation diffracted by the component target structures under the illumination conditions;

a processor arranged to process information characterizing the detected radiation to obtain a measurement of the property of the structure, wherein the optical system includes a radiation source apparatus comprising:

a container comprising a first wall portion and a second wall portion defining a space configured to contain a gaseous medium in which radiation emitting plasma is generated following excitation of the gaseous medium by a driving radiation; and a thermal load applicator configured to apply a thermal load to the first wall portion to reduce a thermal gradient between the first wall portion and the second wall portion, thereby reducing stresses in the first and second wall portions, and wherein the lithographic apparatus is configured to use the measurement results from the inspection apparatus in applying the pattern to further substrates.

25. A method of measuring a property of structures that have been formed by a lithographic process on a substrate, the method comprising:

illuminating the structures using output radiation of a radiation source apparatus, the radiation source comprising:

a container comprising a first wall portion and a second wall portion defining a space containing a gaseous medium in which radiation emitting plasma is generated following excitation of the gaseous medium by a driving radiation, and a thermal load applicator configured to apply a thermal load to the first wall portion to reduce a thermal gradient between the first wall portion and a second wall portion, thereby reducing stresses in the first and second wall portions;

detecting radiation diffracted by the structures; and determining from properties of the diffracted radiation one or more properties of the structure.

26. A method of manufacturing devices, comprising:

applying a device pattern to a series of substrates using a lithographic process;

inspecting at least one composite target structure formed as part of or beside the device pattern on at least one of the substrates using a method comprising:

illuminating the structures using output radiation of a radiation source apparatus, the radiation source comprising:

a container comprising a first wall portion and a second wall portion defining a space containing a gaseous medium in which radiation emitting plasma is generated following excitation of the gaseous medium by a driving radiation, and a thermal load applicator configured to apply a thermal load to the first wall portion to reduce a thermal gradient between the first wall portion and the second wall portion, thereby reducing stresses in the first and second wall portions;

detecting radiation diffracted by the structures; and determining from properties of the diffracted radiation one or more properties of the structure; and controlling the lithographic process for later substrates in accordance with the result of the inspection method.

\* \* \* \* \*